United States Patent [19]

Lapin et al.

[11] Patent Number: 5,510,226
[45] Date of Patent: *Apr. 23, 1996

[54] STEREOLITHOGRAPHY USING VINYL ETHER-EPOXIDE POLYMERS

[75] Inventors: Stephen C. Lapin, Wauconda; James R. Snyder, Chicago; Eugene V. Sitzmann, Elk Grove Village, all of Ill.

[73] Assignee: AlliedSignal Inc., Morris Township, Morris County, N.J.

[*] Notice: The term of this patent shall not extend beyond the expiration date of Pat. No. 5,437,964.

[21] Appl. No.: 230,444

[22] Filed: Apr. 20, 1994

Related U.S. Application Data

[63] Continuation of Ser. No. 693,890, May 1, 1991, abandoned.

[51] Int. Cl.$^6$ .................................................. G03C 5/00
[52] U.S. Cl. ........................ 430/269; 430/280; 522/170
[58] Field of Search ................................ 430/269, 280; 522/170

[56] References Cited

U.S. PATENT DOCUMENTS

| | | | |
|---|---|---|---|
| 4,575,330 | 3/1986 | Hull | 425/174.4 |
| 4,844,144 | 7/1989 | Murphy et al. | 164/38 |
| 4,942,001 | 7/1990 | Murphy et al. | 264/22 |
| 4,956,198 | 9/1990 | Shama et al. | 427/54.1 |
| 5,004,842 | 4/1991 | Klemarczyk | 526/313 |
| 5,045,572 | 9/1991 | Plotkin | 522/170 |
| 5,106,885 | 4/1992 | Liu | 522/170 |

FOREIGN PATENT DOCUMENTS

| | | | |
|---|---|---|---|
| 1246785 | 12/1988 | Canada . | |
| 0171069 | 2/1986 | European Pat. Off. . | |
| 0360869 | 2/1989 | European Pat. Off. | C08G 59/68 |
| 0429250 | 5/1991 | European Pat. Off. . | |
| 2355794 | 1/1978 | France . | |
| WO89/08021 | 9/1989 | WIPO . | |
| WO90/01512 | 2/1990 | WIPO . | |
| WO90/03989 | 4/1990 | WIPO . | |
| WO-A-9111466 | 8/1991 | WIPO . | |

OTHER PUBLICATIONS

Lapin "Vinyl Ether Terminated Ester Monomers—" Radtech '90 North AM. Conf. Proceedings, vol. 1, pp. 410–416 Mar. 1990.

Crivello et al., "Photoinitiated Cationic Polymerization with Multifunctional Vinyl Ether Monomers" Jan. 1983, pp. 6–13.

C. W. Hull, "Recent Advances in Stereolothography" Oct. 1., 1990.

*Primary Examiner*—Mark Chapman
*Attorney, Agent, or Firm*—Harold N. Wells; Roger H. Criss

[57] ABSTRACT

Polymer precursor formulations suitable for stereolithography may be prepared from compositions containing vinyl ether functionalized compounds and epoxy functionalized compounds plus an effective amount of a cationic photoinitiator.

33 Claims, 2 Drawing Sheets

STEREOLITHOGRAPHY USING VINYL ETHER-EPOXIDE POLYMERS

This application is a continuation of application Ser. No. 07/693,890 filed May 1, 1991, now abandoned.

PRIOR ART

This invention relates to the art of stereolithography, which is a technique for forming solid shapes from a liquid polymer precursor. More particularly, the invention relates to improvements in such polymer precursors.

Stereolithography is described in U.S. Pat. No. 4,575,330 to Hull. The method involves building up a predetermined three-dimensional shape by forming a series of layers of polymerized solids. A cross-section of the solid is traced out on the surface of a bath of polymer precursors under the direction of a computer controlled system which causes the liquid to be exposed to a form of radiation such as an ultraviolet laser. After each polymerized layer is formed, it is lowered in the bath so that a new layer can be formed on top. Hull does not discuss in detail the type of polymer precursors which may be used, confining his discussion to the equipment used in the stereolithographic process. He states that the curable liquid (i.e., the polymer precursor) should cure fast enough to allow practical object formation times, should be self-adherent, should have a relatively low viscosity, should absorb UV light, should be soluble when not polymerized but insoluble when polymerized, and should be non-toxic. Hull suggests that acrylate formulations may be used and subsequent publications show that acrylate compositions have been preferred heretofore.

In WO 89/08021 and U.S. Pat. No. 4,942,001 DeSoto, Inc. disclose the use of a formulation which combines both acrylates and methacrylates. Their polymer precursor solution is comprised of resinous polyacrylates and polymethacrylates dissolved in liquid polyacrylates and polymethacrylates. They state that if both the liquid and resinous materials are polymethacrylates they cure too slowly, while if both are polyacrylates they cause distortion of the solid product. Consequently, they use one type as the resinous material and the other as the liquid. They suggest that in practice an N-vinyl monomer is included to increase the curing speed and by using the liquid polyacrylates or polymethacrylates distortion is reduced. They prefer the use of a resinous polyacrylate with a liquid polymethacrylate. The polyacrylate resins preferred are polyurethane diacrylates, particularly those which have a polyester base. The preferred N-vinyl monomer is N-vinyl pyrrolidone.

Another disclosure of interest is U.S. Pat. No. 4,844,144, also assigned to DeSoto Inc., which involves dispersing a thermoplastic material in the liquid polymer precursor so that the solid formed by stereolithography contains the thermoplastic material. Such a solid polymer is said to be useful in the investment casting process since the thermoplastic material prevents the acrylate polymer from expanding when the solid is burned out of a mold. The acrylates and methacrylates used as polymer precursors are closely related to those disclosed in WO 89/08021 discussed above.

Acrylates are not entirely satisfactory for use in stereolithography. They are not as non-toxic as one would be like and they are not cured as rapidly and completely as would be desired. Post-curing of the solids formed by stereolithography is necessary and it is difficult to obtain rapid and complete curing of acrylates by exposure to intense UV light or exposure to elevated temperatures.

It is possible to employ polymer precursors based on vinyl ether compounds which have significant advantages over the acrylate-based formulations used heretofore in stereolithography. In co-pending U.S. patent application Ser. No. 07/661,766, now abandoned incorporated by reference herein, compositions of vinyl ether oligomers and monomers were shown to be suitable for stereolithography.

Vinyl ethers have been mentioned in other previous publications relating to stereolithography.

A vinyl ether urethane was disclosed in Example 6 of French Patent 2,355,794. It was combined with a diacrylate and cured by exposure to an electron beam. There was no suggestion in this 1977 patent that such mixtures could be used in stereolithography, since it apparently preceded the development of that technology.

The use of vinyl ethers in stereolithography was suggested in WO 90/01512, but in combination with maleates or fumarates and in the presence of specific types of photoinitiators.

In U.S. Pat. No. 4,956,198 assigned to DeSoto, Inc. coatings intended for use in optical glass fibers were said to have application to stereolithography as well. Such coatings included vinyl ether terminated polyurethane produced from certain diisocyanates reacting with polyols and then capping with monohydroxyl vinyl ethers.

In WO 90/03989 DeSoto, Inc. addressed the use of vinyl ethers in stereolithography using a transvinylation reaction product to react with a diisocyanate to prepare urethane oligomers. The transvinylation reaction converted a polyhydric alcohol into a mixture of products having one or more of the hydroxyl groups in the alcohol converted to a vinyl ether group. The mixture was thereafter reacted with a diisocyanate via the residual hydroxyl groups to produce a vinyl ether urethane.

Further improvement in compositions useful in stereolithography have been sought, particularly with regard to improving the accuracy of the finished parts. The present inventors have found improved compositions comprising vinyl ethers and epoxy compounds which provide advantages over those previously disclosed.

Vinyl ethers have been combined with epoxy compounds for use as coatings. For example, Crivello reported (*Journal of Radiation Curing,* Jan. 1983, p. 6–13) UV cure of vinyl ether-epoxy mixtures using cationic photoinitiators. The faster curing of vinyl ethers was advantageous, while the epoxy compounds provided their inherent properties to the film.

SUMMARY OF THE INVENTION

Broadly, the invention comprises polymer precursor compositions suitable for stereolithography, such compositions comprising vinyl ether functionalized compounds plus epoxy functionalized compounds with an effective amount of a cationic photoinitiator. Both the vinyl ethers and epoxides are curable by acid released by said photoinitiator and are used in proportions selected to provide a polymeric structure having suitable green strength when vinyl ether compounds are polymerized by a suitable light source, such as UV or visible laser in stereolithography. More particularly, the vinyl ethers may be derived from urethanes, phenols, esters, polyethers, polysiloxanes and aliphatic or aromatic hydrocarbons. The epoxides may include those derived from phenols, particularly bisphenol A, novolacs, linear and cycloaliphatic polyols, and polyether polyols. Preferably, both the vinyl ether compounds and the epoxides will have a functionality of 2 or more.

In one embodiment the polymer precursor compositions are formulated with vinyl ether compounds and epoxides such that the composition can be characterized by the formula $$M = \frac{F}{E}$$

where
- M is the vinyl ether equivalent weight of the composition
- F is the total weight in grams of the composition, including both vinyl ether and epoxy compounds
- E is the number of vinyl ether equivalents in the composition The vinyl ether equivalent weight of the composition (M) should be between 150 and 800 and preferably between 250 and 450. The viscosity of the composition should generally be low, but may range from 50 to 50,000 mPa.s, preferably between 50 and 5000 mPa.s.

A cationic photoinitiator is used preferably in the amount of about 0.1 to 5 wt. % of the composition. Typical photoinitiators are onium salts of Group V, VI, and VII elements, particularly iodonium or sulfonium salts.

In one aspect the invention is a process for forming three-dimensional objects by exposing a bath of the above compositions to repeated exposure to actinic light, such as ultraviolet or visible light from a laser.

DESCRIPTION OF THE PREFERRED EMBODIMENTS

Figure 1:
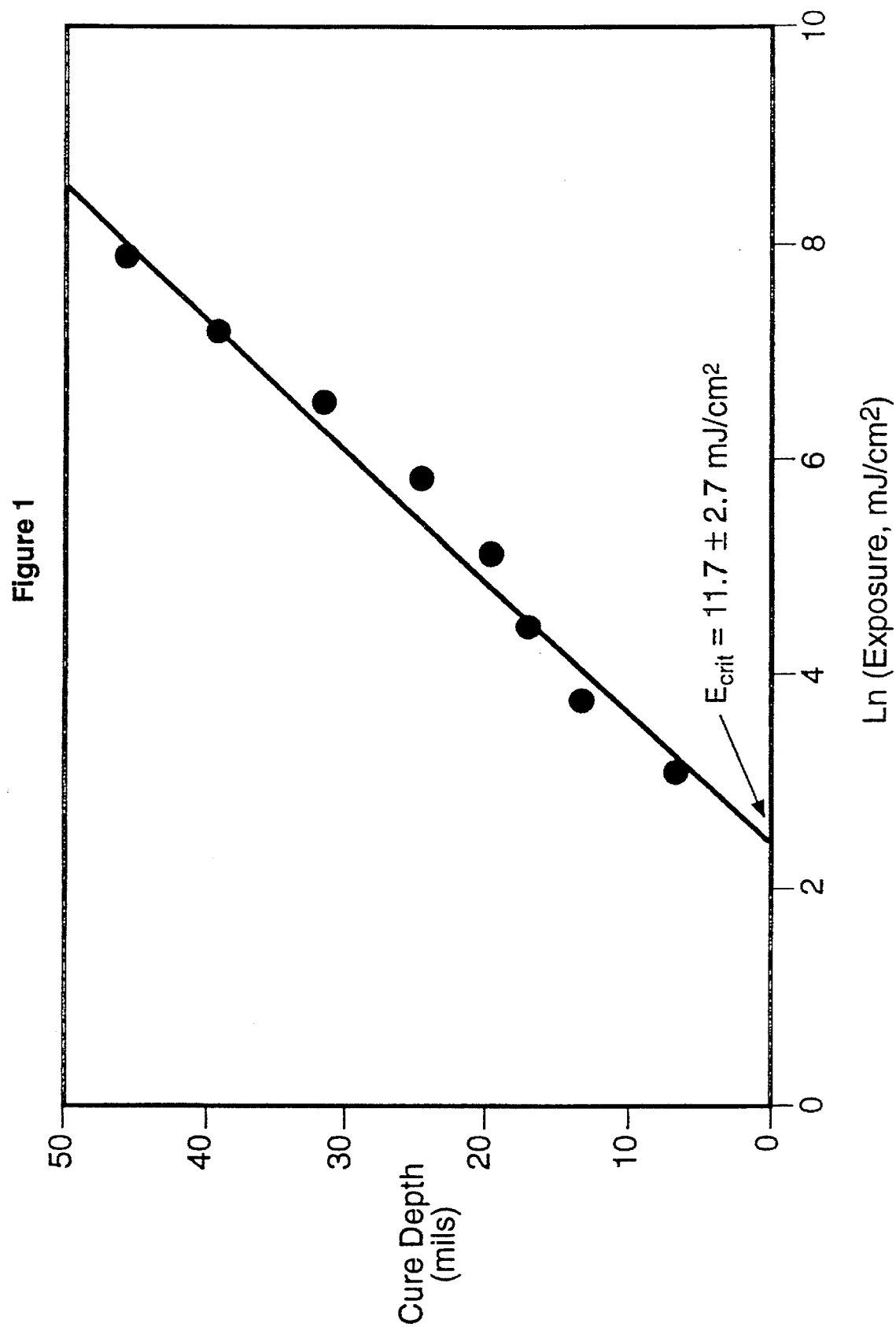
FIG. 1 is a plot of cure depth versus laser exposure for a vinyl ether/epoxy composition.

Compositions of the invention comprise vinyl ethers and epoxides. In general, vinyl ether functionalized compounds of interest would include those described in co-pending application 07/661,766, which is incorporated herein by reference. The epoxides will generally include the broad classes of available epoxy functionalized compounds such as those derived from phenols, particularly bisphenol A, novolacs, linear or cycloaliphatic diols and polyether diols.

The present inventors have found that by combining vinyl ethers with epoxides that a major deficiency of previous compositions for use in stereolithography can be overcome. In particular, they have found that the distortion which heretofore has been present in three-dimensional parts made by stereolithography can be substantially reduced. This problem will be discussed in more detail later, but for present purposes the distortion may be considered to result particularly during the initial forming of a laser cured or "green" structure in stereolithographic equipment. However, by combining vinyl ethers with epoxides the present inventors have found that it is possible to rapidly cure the vinyl ethers while leaving the epoxide largely uncured. This provides a "green part" having sufficient strength to be handled but having little distortion. Then, the green piece can be thermally post-cured so that the epoxide cures under the influence of the photo acids generated during the UV or visible laser exposure. Since thermal post-curing is isotropic, any additional shrinkage that occurs will not produce additional distortion in the part.

Vinyl Ethers

As previously mentioned, the vinyl ethers of co-pending application 07/661,766 may be useful in the present invention. In that application the vinyl ethers are defined as oligomers and monomers derived from various base compounds and both types were used in formulations useful in stereolithography. In the present invention we prefer to characterize the vinyl ethers by their physical properties. The vinyl ethers found to be useful will generally have as many as possible of the following properties.

- have a fast cure under UV laser exposure so that a rigid "green" part can be made
- have low viscosity to facilitate flow of the prepolymers over the surface of the article being formed
- have a relatively high modulus as first formed by the laser beam, i.e., in the green form
- have a functionality of at least 2, that is, have at least two vinyl ether moieties in each molecule
- have minimal absorption of light from the laser beam Preferred vinyl ethers which have been found to be particularly useful include bisphenol A derivatives and other aromatic vinyl ethers including

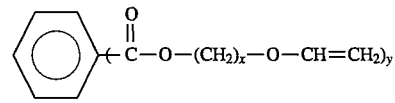

where
x is 2 or 4
y is 2 or 3

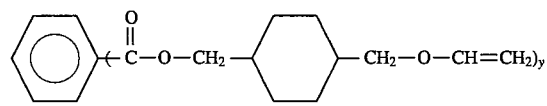

where
y is 2 and ester derived vinyl ethers including

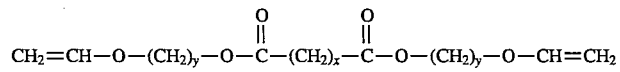

where
x is 2, 3, or 4
y is 2 or 4
and

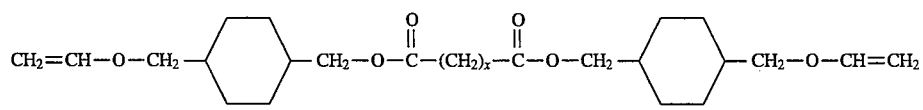

where x is 2, 3, or 4 and cycloaliphatic diol derived vinyl ethers including

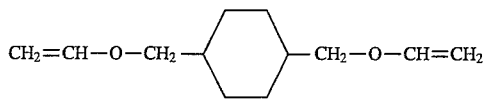

and poly ether derived divinyl ethers including

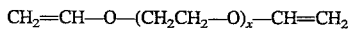

where x is 2, 3, or 4

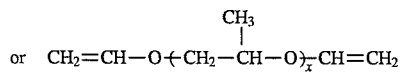

where x is 2, 3, or 4

$$CH_3CH_2—C(CH_2—O—CH_2CH_2—O—CH=CH_2)_3$$

and phenol derived vinyl ethers including

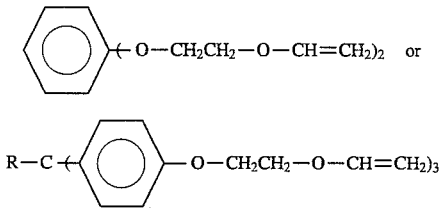

where R is H or $CH_3$

Epoxides

The epoxides which are useful in the invention should have as many as possible of the following properties have a functionality of at least two, that is, have at least two oxirane moieties for each molecule have a low cure rate relative to the vinyl ethers used in the formulation contribute a low viscosity to the formulation do not plasticize vinyl ether polymerized by the laser are miscible with the selected vinyl ethers have minimal absorption of light from the laser beam Preferred epoxides include those derived from phenols, particularly bisphenol A, novolacs, linear and cyclo aliphatic polyols, and poly ether polyols. In general, many of the available epoxides may find application in the invention. Of particular interest are glycidyl ethers of phenols. Cycloaliphatic epoxides, which may be used but not necessarily with equivalent results. Examples of glycidyl ethers are bisphenol A diglycidyl ethers (e.g. DER 331, 332, Dow Chemical) and Epon 828, Shell Chemical). Other examples are epoxy novolacs (e.g. Quatrex 240, DEN 431, Dow Chemical) and epoxy cresols (e.g. Quatrex 3310, Dow Chemical). Examples of cycloaliphatic epoxides (e.g. ERL-4221, ERL-4299, ERL-4234, Union Carbide).

Formulation of Polymer Precursor Compositions

An important aspect of the selection of vinyl ethers and epoxides for use in stereolithography is the viscosity of the formulation. In general, the final formulations should have a viscosity in the range of 50 to 50,000 mPa.s, preferably 50–5000 mPa.s. The viscosity of the formulation should be relatively low in order to facilitate the movement of the liquid prepolymers over the solid piece being formed by the stereolithography apparatus. The vinyl ethers may have a high viscosity with the epoxides having low viscosity or vice versa. Alternatively, both may have low viscosity. High viscosities are useable, but not preferred.

The proportions of vinyl ethers and epoxides do not depend on their reaction with each other, since they primarily form homopolymers and the final product may be an interpenetrating polymer network. However, the proportions must be selected so that the green structure has acceptable strength and can retain the substantially unreacted epoxides until thermal post-curing can be carried out. It has been found that the proportions of vinyl ethers and epoxides should be within the boundaries defined by the formula $$M = \frac{F}{E}$$

where

M is the vinyl ether equivalent weight of the composition

F is the total weight in grams of the composition, including both vinyl ether and epoxy compounds E is the number of vinyl ether equivalents in the composition The vinyl ether equivalent weight (M) should be between 150 and 800 and preferably between 250 and 450. The defining equation takes no account of the relative number of equivalents of epoxide groups, only the equivalents of vinyl ether groups. If the vinyl ether equivalent weight (M) is too high, the green strength may be too low. If M is too low, the curl distortion may be too high.

An effective amount of a cationic photoinitiator is used to cause the vinyl ethers to react and produce the desired polymer. The recognized classes of cationic photoinitiators include various compounds which respond to irradiation by producing acid species capable of catalyzing cationic polymerization. See Crivello, *Advances in Polymer Science*, 62, p. 1–48 (1984). Onium salts of Group V, VI, and VII elements are stated to be the most efficient and versatile of the cationic photoinitiators. They generate strong Lewis acids which can promote cationic polymerization. Curing of the vinyl ether compositions of the invention is not limited to a particular class of such photoinitiators, although certain types are preferred, including onium salts based on halogens and sulfur. More specifically, the onium salt photoinitiators described in Crivello's U.S. Pat. No. 4,058,400 and in particular iodonium and sulfonium salts of $BF_4^-$, $PF_6^-$, $SbF_6^-$, and $SO_3CF_3^-$. Preferred photoinitiators are triarylsulfonium salts, and diaryliodonium salts. Preferred anions are hexafluorophosphate and hexafluoroantimony. They are usually required in amounts from about 0.1 to 5 wt. % in the blended formula of vinyl ethers and epoxides. Preferred initiators include:

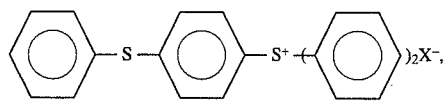

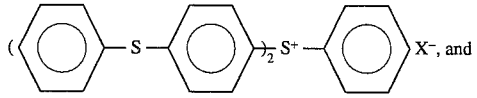

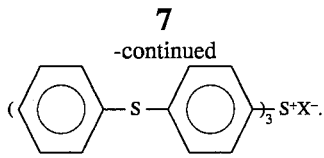

where X is $SbF_6^-$ or $PF_6^-$.

Commercially available initiators include UVI-6974 (an $SbF_6^-$ salt) and UVI-6990 (a $PF_6^-$ salt) supplied by Union Carbide. Other cationic photoinitiators are defined by the formulas

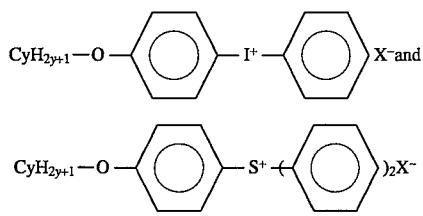

where y is 1 to 18

In addition to the principal ingredients discussed above, the formulations may also contain dyes, stabilizers, fillers, pigments, and antioxidants such as hindered phenols, wetting agents such as fluorosurfactants e.g. FC-430 from 3-M, photosensitizers such as benzophenone, thioxanthone, perylene and other components familiar to those skilled in the art.

Stereolithography

The vinyl ether epoxy formulations of this invention may be polymerized by exposure to known sources of energy such as electron beams, ultraviolet light, high temperatures, and the like. In stereolithographic applications, the polymer formulation forms a liquid bath in which the precursors are polymerized in successive layers, typically by repeated exposure to actinic light, particularly a UV or visible laser beam, such as ultraviolet light from helium/cadmium laser or an argon ion laser or visible light from an argon ion laser. After the three-dimensional shape has been formed, it is removed from the bath, washed as necessary, with isopropanol or other suitable solvent and cured further by thermal means, which could be supplemented by ultraviolet or visible light means if desired.

The vinyl ether-epoxide formulations of the invention have several advantages over the acrylate-based formulations of the art. In particular, the vinyl ethers and epoxides can be post-cured by heating and do not require the use of UV light for post-curing, which is required for acrylate formulations, since they cannot be thermally post-cured, without the use of a thermal initiator which undesirably reduces pot life of the acrylate formulation.

The addition of epoxides to the vinyl ethers disclosed in co-pending application 07/661,766, brings significant improvements not necessarily evident. Distortion of the object produced by stereolithography is a major problem with currently used polymerizable formulations. (See the paper by Hull, *Recent Advances in Stereolithography*, 1990.) That is, the object produced does not precisely match the shape wanted, even though that shape is accurately traced out by the UV laser beam. Such distortion can be quite severe and certainly limits the usefulness of stereolithography in manufacturing. The difficulties are believed to result from several factors. One source of inaccuracy is caused by the stress created when one layer of photo polymer is laser cured and shrinks on top a previously cured layer. The result is a tendency to warp the layers. This phenomenon has been called "curl distortion." Another source of inaccuracy occurs during post-curing. The "green" (i.e. partially cured) shape may not receive uniform amounts of the UV or visible light which may cause the part to bend or become distorted. This phenomenon has been called "post-cure distortion."

It has now been found that by including epoxides in the vinyl ether formulations of co-pending application 07/661,766 that the distortion in the parts made by stereolithography is much reduced. This is believed to result from the difference in speed of polymerization. The vinyl ethers polymerize quickly and thus are capable of producing a "green" shape in which little, if any, of the epoxides are polymerized. At that time little distortion has occurred. Since the epoxides are principally cured in a thermal post-curing step, their effect on the shape as they polymerize is minimal. This post-curing also requires the photoacids, produced by the action of the laser on the photoinitiator, but these are long-lived and remain in the polymers during the post-curing. Typically, the post-curing is done thermally by exposure to a temperature of about 50° C. to 200° C. for 0.2 to 10 hours. Alternatively, post-curing can be supplemented or even carried out entirely using UV or visible light, but this procedure may result in additional distortion because it is difficult to obtain uniform exposure of complex solid shapes.

Example 1

A vinyl ether/epoxy formulation having an M value of 500 grams of formulation for each vinyl ether equivalent consisting of 1,4-cyclohexane dimethanol divinyl ether (19.6%), DER 331 (80.4%), and UVI-6974 (2.5 pph) was placed in a dish on a motor driven platform under the UV output (351, 360 nm) of an Argon ion laser (ca. 13 milliwatts). The dish was moved through the beam at speed of 61 mm/min (2.4 inches/min). A "string" of solid polymer was created along the path of the laser in the dish. The string had an average thickness of 0.94 mm (0.037 inches) and was 0.23 mm (0.009 inches) wide. The string was very soft and elastomeric. After thermal post curing (20 min. @100° C.), the string was stronger and more rigid, indicating that additional conversion of polymerizable groups occurs under these conditions.

Example 2

A mixture of 19.6 wt. % 1,4-cyclohexane dimethanol divinyl ether and 80.4 wt. % DER 331 was prepared and 0.4 pph of UVI-6974 was added. The mixture was coated on a sodium chloride infrared window and then cured by exposure to UV light (500 mj/cm²) using a medium pressure mercury arc lamp. Then the UV cured coating was cured further at 100° C. for 60 minutes. An infrared spectrum was measured before curing and after the UV and thermal curing. The disappearance of the 1635 cm⁻¹ band indicated that 87% of the vinyl ether had reacted while disappearance of the 916 cm⁻¹ band showed that only 29% of the epoxy had been reacted after the exposure to UV light. However, after the thermal postcure at least 95% of the epoxy groups had been reacted, thus illustrating that epoxy cures later than the vinyl ether which was polymerized mainly during the UV exposure.

Example 3

A group of vinyl ether monomers were mixed with a commercial epoxy (DER331, Dow Chemical) which is a diglycidyl ether of hisphenol A. Each of the formulations had an M value of 500 grams of formulation for each equivalent of vinyl ether. A triaryl sulfonium salt initiator was added at 0.5 pph (Union Carbide UVI-6974). The mixtures were coated on a glass plate and cured by UV irradiation at 500 mj/cm² using a medium pressure mercury arc lamp. Thereafter the cured films were removed from the glass plates and measured for their shrinkage and tensile strength. The films were next thermally postcured for 60 minutes at 100° C. and measured again. The results are presented in the following table.

Example 7

The experiment of Example 6 was repeated except that the width (rather than depth) of the parts was measured. The following table shows the results.

TABLE A

| Sample | Vinyl Ether Monomer | Vinyl Ether Wt. % | Epoxy Wt. % | Shrinkage (%) | | Modulus, MPa (Ksi) | | Tensile Strength, MPa (Ksi) | | Elongation, % | |
|---|---|---|---|---|---|---|---|---|---|---|---|
| | | | | UV | Postcure | UV | Postcure | UV | Postcure | UV | Postcure |
| A | 1,4-cyclohexane dimethanol-divinyl ether (CHVE) | 19.6 | 80.4 | 4.1 | 4.8 | 1172(170) | 2158(313) | 25.5(3.7) | 77.9(11.3) | 14.8 | 7.9 |
| B | bis (4-vinyloxy butyl) isophthalated)[1] | 34.8 | 65.2 | 4.4 | 5.3 | 814(118) | 1923(279) | 20(2.9) | 55.2(8.0) | 58 | 7.2 |
| C | bis (4-vinyloxy methyl cyclohexyl methyl) glutarate[2] | 43.6 | 56.4 | 3.2 | 4.6 | 621(90) | 1723(250) | 17.2(2.5) | 50.3(7.3) | 49 | 7.0 |
| D | bis (4-vinyl oxybutyl) succinate | 31.0 | 69.0 | 3.7 | 5.4 | 1034(150) | 1675(243) | 24.9(3.6) | 44.1(6.4) | 6.8 | 4.5 |
| E | bisphenol-A diethoxy vinyl ether | 36.8 | 63.2 | 3.5 | 4.1 | 752(109) | 2206(320) | 28.3(4.1) | 69.6(10.1) | 24.7 | 6.8 |

[1]Vectomer ™ 4010, Allied-Signal
[2]Vectomer ™ 4020, Allied-Signal

The increased modulus and tensile strength indicates that a thermal post-curing reaction is occurring in all of these formulations.

Example 4

46 parts by weight of bisphenol-A-diethoxy vinyl ether (BPEVE) and 54 parts by weight of a diglycidyl ether of bisphenol-A (DER 331, Dow Chemical) were mixed with 0.44 pph of triaryl sulfonium salt as a photoinitiator (UVI-6974, Union Carbide). This polymer precursor composition (M=400) was a clear liquid with a viscosity of 1,724 cps at 30° C.

Example 5

The composition of Example 4 was placed in a shallow dish in a 3D Systems Model SLA-190 stereolithography unit at 30° C. The laser (He-Cd, 325 nm output) was scanned across the resin at various speeds to produce a series of rectangular layers varying in depth depending on the time of exposure. The resulting series of cured rectangles (resembling a railroad track with the rectangular layers being the cross-ties) was removed from the bath 18.5 minutes after exposure and the thickness of the layers were measured with a micrometer. A plot of the thickness of the layers versus the exposure is shown in FIG. 1. It will be seen that a linear relationship between the depth of cure and the exposure resulted. $E_{crit}$ is the minimum exposure which induced polymerization.

Example 6

Figure 2:
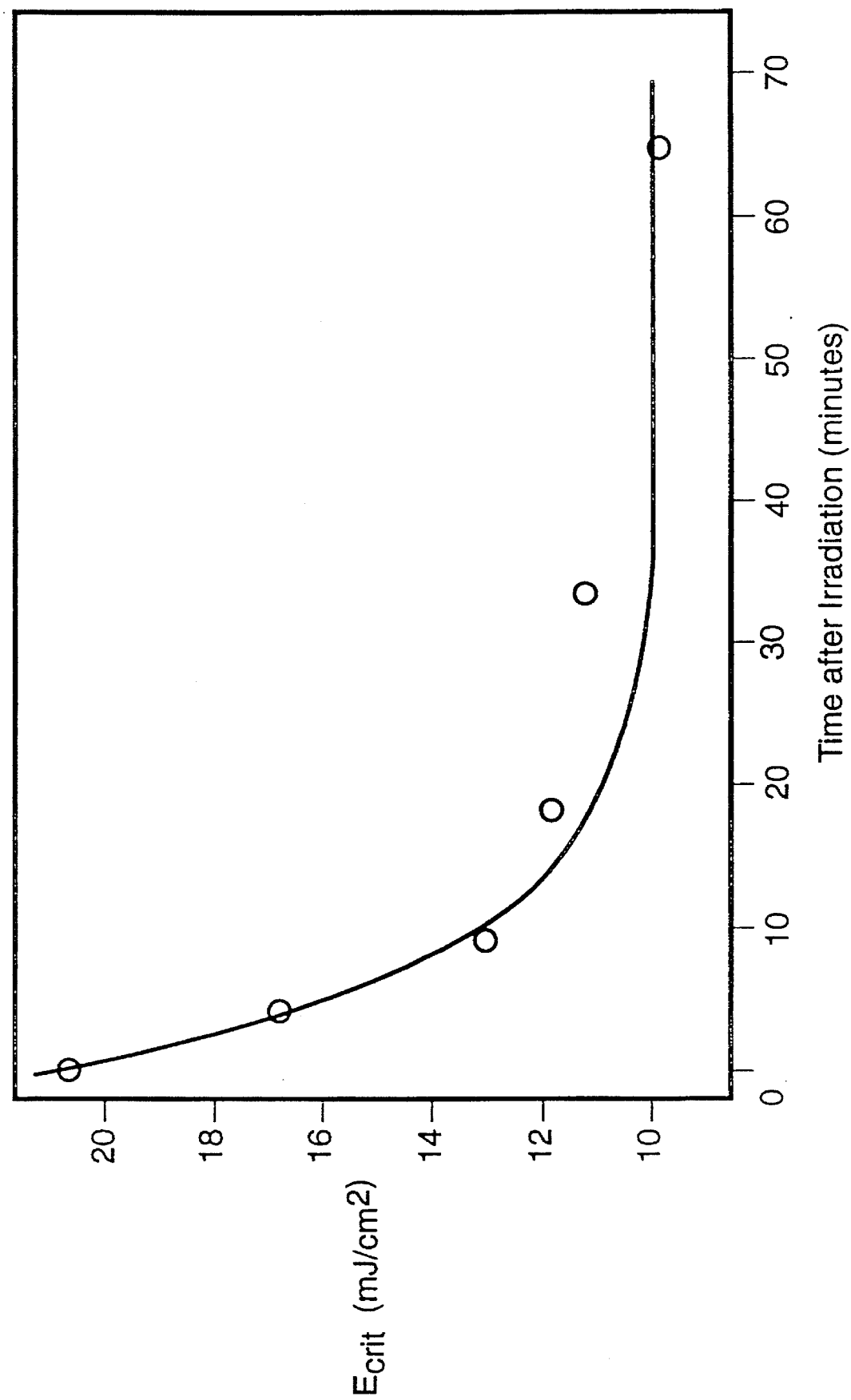
FIG. 2 is a plot of $E_{crit}$ (gel/dose) versus time for the composition of FIG. 1.

The experiment of Example 5 as repeated except that instead of 18.5 minutes the test parts were removed at varying times after laser irradiation. The minimum exposure required, $E_{crit}$, was found to decrease as the time increased as shown in FIG. 2. It can be seen that the minimum value for $E_{crit}$ was achieved at about 30 minutes and reducing the exposure had essentially no effect even after much longer periods of time.

TABLE B

| Time in Dish After Irrad. | Width (mm) versus Laser Dose (J/cm$^2$) | | | | |
|---|---|---|---|---|---|
| (min) | 5.6 | 2.8 | 1.4 | 0.7 | 0.35 |
| <0.1 | 1.63 | 1.58 | 1.54 | 1.50 | 1.44 |
| 0.5 | 1.60 | 1.58 | 1.55 | 1.50 | 1.50 |
| 4.25 | 1.63 | 1.60 | 1.50 | 1.50 | 1.45 |
| 9.0 | 1.63 | 1.58 | 1.56 | 1.55 | 1.46 |
| 18.5 | 1.63 | 1.58 | 1.50 | 1.48 | 1.40 |
| 33.5 | 1.63 | 1.58 | 1.55 | 1.50 | 1.45 |
| 41.0 | 1.63 | 1.58 | 1.52 | 1.51 | 1.45 |
| 64.6 | 1.63 | 1.58 | 1.55 | 1.54 | 1.45 |

It can be seen that there was essentially no polymerization except where the laser contacted the polymer precursor liquid, i.e., the width of the layer did not increase due to the laser-initiated polymerization.

Example 8

The composition of Example 4 was used in the same apparatus to produce a tensile test specimen. The test part was removed less than one minute after irradiation. Tensile measurements were made within 30 minutes. This test part was compared with equivalent parts which were further cured in an oven at 80° C. for 60 minutes. The results of tensile testing are given in the following table.

TABLE C

| Cure | Tensile, Strength MPa | Modulus MPa | Elongation % |
|---|---|---|---|
| Laser only | 7.6 | 76 | 53 |
| Laser + thermal | 49 | 1500 | 7.8 |

These results indicate the significant increase in strength obtained from thermal postcuring of the vinyl ether/epoxy composition of the invention.

Example 9

The composition of Example 4 was used in the same stereolithographic equipment to make three-dimensional test parts using a "weave" laser drawing procedure developed by 3D Systems. The part made was 42 mm long and 3 mm wide with a depth of 6 mm for 14 mm distances from each end and 8 mm for 14 mm in the middle of the piece. It was postcured at 80° C. for 60 minutes. A curl distortion factor $CF_6$ was determined to be 4.9% applying the formula (see paper by C. W. Hull referred to previously):

$$CF_6 = \frac{H_0 - H_6}{6} (100)$$

where $H_o$=height defined by the CAD model $H_6$=height of the test part measured 6 mm from the 8 mm deep base

Example 10

The experiment of Example 6 was repeated using a commercial acrylate/methacrylate resin (Ciba Geigy XB-5139). The test part was postcured by ultraviolet light in a 3D Systems Model PCA-1 postcuring apparatus (the Ciba Geigy resin does not thermally postcure). A cure distortion factor of 17.7% was measured, indicating the advantage for the vinyl ether/epoxy compositions of the invention.

Example 11

The composition of Example 4 was used to make a model of a turbine blade and its housing. The part was thermally cured at 80° C. for 60 minutes. It was an accurate representation of the CAD model.

Example 12

One standard for stability of a stereolithographic resin is that there should be less than 100% change in viscosity for 6 months at 30° C. or 3 days at 80° C.

A vinyl ether/epoxy formulation was prepared comprising 46% bisphenol-A-diethyoxy vinyl ether (BPEVE) and 54% of a diglycidyl ether bisphenol-A (DER-331, Dow Chemical) along with 0.44 pph of a triarylsulfonium salt photoinitiator (UVI-6974, Union Carbide). The viscosity of the mixture was measured at 30° C. using a Brookfield Viscometer, small sample adapter and spindle 28 at 100 rpm. This mixture was a clear liquid with a viscosity of 1,724 mPa.s (cps) at 30° C. The mixture was then used for the fabrication of several stereolithographic parts. The mixture was then placed in an oven at 85° C. for three days. The clear liquid after heating had a viscosity of 1,771 mPa.s (cps) at 30° C. After three days at 85° C., the mixture showed an increase in viscosity of only 2.7%, which exceeds the stability requirement for a stereolithographic resin.

Example 13 (Comparative)

A comparison of the thermal stability of the vinyl ether/epoxy mixture described in Example 12 to a commercial acrylate/methacrylate stereolithography resin (Ciba Geigy XB-5139) was made. The fresh XB-5139 resin had a viscosity of 844 mPa.s (cps) (measured at 30° C.), which increased to 1,047 cps (at 30° C.) after heating at 85° C. for 60 hours. Thus, the commercial XB-5139 resin showed a significant 24% increase in its viscosity, and therefore a lower thermal stability compared to the vinyl ether/epoxy formulation from Example 12.

Example 14

A vinyl ether terminated aromatic diester/epoxy formulation was prepared comprising 60% bis(4-vinyloxybutyl)isophthalate vinyl ether (Vectomer 4010, Allied-Signal), and 40% diglycidyl ether of bisphenol-A (DER-331, Dow Chemical) along with 0.453 pph of a triarylsulfonium salt photoinitiator (UVI-6974, Union Carbide). This mixture (M=300) was a clear liquid with a viscosity of 150 cps at 30° C.

The formulation was placed in a shallow dish within a 3D Systems SLA-190 stereolithography apparatus at 30° C. The laser (He-Cd, 325 nm output) was scanned across the resin at various speeds effectively producing a series of small rectangular shaped cured layers that were exposed with different doses of UV laser light. The test part was removed from the dish after exposure and the thickness of the ties were measured with a micrometer. A plot of thickness (cure depth) vs. exposure yielded a straight line, and from the intercept $E_{crit}$=40 mJ/cm$^2$.

The formulation was used to construct multi-layer three dimensional diagnostic test parts as in Example 9 using the SLA-190 with a "weave" laser drawing scheme. A curl distortion factor ($CF_6$) of 1.5% was obtained by comparing the dimensions of the test part to the original CAD model.

Example 15

The formulation from Example 14 was used to build a multi-layer three dimensional part. The part originated from a CAD model of a turbine blade and housing. After fabrication with the SLA-190, a rigid plastic part was obtained. The part appeared to be an accurate representation of the original CAD model.

Example 16

A vinyl ether terminated aromatic diester/epoxy-novolac formulation was prepared comprising 60% bis(4-vinyloxybutyl)isophthalate vinyl ether (Vectomer 4010, Allied-Signal), and 40% of a phenol epoxy novolac resin (Quatrex-2410, Dow Chemical) along with 0.457 pph of a triarylsulfonium salt photoinitiator (UVI-6974, Union Carbide). This mixture (M=300) was a clear liquid (a slight yellow color) with a viscosity of 2,191 cps at 30° C.

The formulation was placed in a shallow dish within a 3D Systems SLA-190 stereolithograpghy apparatus at 30° C. The laser (He-Cd, 325 nm output) was scanned across the resin at various speeds effectively producing a series of small rectangular shaped cured layers that were exposed with different doses of UV laser light. The test part was removed from the dish after exposure and the thickness of the ties were measured with a micrometer. A plot of thickness (cure depth) vs. exposure yielded a straight line, and from the intercept $E_{crit}$=25 mJ/cm$^2$.

The formulation was used to construct multi-layer three dimensional diagnostic test parts as in Example 9 using the SLA-190 with a "weave" laser drawing scheme. A curl distortion factor ($CF_6$) of 9% was obtained by comparing the dimensions of the test part to the original CAD model.

Example 17

The formulation from Example 16 was used to build a multi-layer three dimensional part. The part originated from a CAD model of a turbine blade and housing. After fabrication with the SLA-190, a rigid plastic part was obtained. The part appeared to be an accurate representation of the original CAD model.

Example 18

The formulation from Example 16 was used to build a multi-layer three dimensional part. The part originated from a CAD model of a distributor cap and housing. After fabrication with the SLA-190, a rigid plastic part was obtained. The part appeared to be an accurate representation of the original CAD model.

Example 19

A vinyl ether terminated aromatic diester/epoxy-novolac/diglycidyl aromatic ether formulation was prepared comprising 60.5% bis(4-vinyloxybutyl)isophthalate vinyl ether (Vectomer 4010, Allied-Signal), 25.5% phenol epoxy novolac resin (Quatrex-2410, Dow Chemical), and 14% diglycidyl ether of bisphenol-A (DER-332, Dow Chemical) along with 0.48 pph of a triarylsulfonium salt photoinitiator (UVI-6974, Union Carbide). This mixture (M=300) was a clear liquid (a slight yellow color) with a viscosity of 497 cps at 30° C.

The formulation was placed in a shallow dish within a 3D Systems SLA-190 stereolithography apparatus at 30° C. The laser (He-Cd, 325 nm output) was scanned across the resin at various speeds effectively producing a series of small rectangular shaped cured layers that were exposed with different doses of UV laser light. The test part was removed from the dish after exposure and the thickness of the ties were measured with a micrometer. A plot of thickness (cure depth) vs. exposure yielded a straight line, and from the intercept $E_{crit}$=25 mJ/cm$^2$.

The formulation was used to construct multi-layer three dimensional diagnostic test parts as in Example 9 using the SLA-190 with a "weave" laser drawing scheme. A curl distortion factor ($CF_6$) of 15% was obtained by comparing the dimensions of the test part to the original CAD model.

We claim:

1. In the process for forming a three-dimensional object from a liquid polymer precursor comprising repeatedly exposing the surface of a bath of said precursor to a beam of actinic light to solidify successive layers of said precursor to make a green structure followed by postcuring of said green structure the improvement comprising employing as said liquid polymer precursor the composition consisting essentially of (a) at least one multifunctional vinyl ether compound;
   (b) at least one multifunctional epoxy compound;
   (c) an effective amount of a cationic photoinitiator;

said vinyl ether compounds and epoxy compounds both being curable by acids released by said photoinitiator and having proportions of (a), (b), and (c) selected to provide a polymeric structure having suitable green strength with minimal curl distortion when said composition is polymerized by an actinic light source selected from the group consisting of UV and visible light lasers, the proportions of said vinyl ether compounds and epoxides being defined by the formula M=F/E
where M is the vinyl ether equivalent weight of the composition and between 150 and 800

F is the total weight in grams of the composition, and

E is the number of vinyl ether equivalents in the composition.

2. The process of claim 1 wherein said actinic light is ultraviolet light produced by a helium/cadmium laser.

3. The process of claim 1 wherein said actinic light is ultraviolet light produced by an argon ion laser.

4. The process of claim 1 wherein said actinic light is visible light produced by an argon ion laser.

5. The process of claim 1 wherein said three-dimensional object is postcured.

6. The process of claim 5 wherein said postcuring is provided by heating.

7. The process of claim 1 wherein M is between 250 and 450.

8. The process of claim 1 wherein the viscosity of said polymer precursor composition is between 50 and 50000 mPa.s.

9. The process of claim 8 wherein the viscosity of said polymer precursor composition is between 50 and 5000 mPa.s.

10. The process of claim 1 wherein said vinyl ether compounds have a functionality of 2 or more.

11. The process of claim 1 wherein said epoxy compounds have a functionality of 2 or more.

12. The process of claim 1 wherein said vinyl ether compounds are derived from at least one member of the group consisting of urethanes, phenols, esters, ethers, siloxanes, and aliphatic or aromatic hydrocarbons.

13. The process of claim 12 wherein at least one vinyl ether has the formula

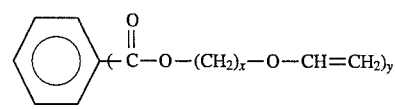

wherein x is 2 or 4 y is 2 or 3.

14. The process of claim 12 wherein at least one vinyl ether has the formula

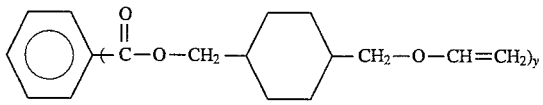

where y is 2.

15. The process of claim 12 wherein at least one vinyl ether has the formula

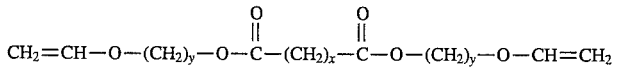

where x is 2, 3, or 4 y is 2 or 4.

16. The process of claim 12 wherein at least one vinyl ether compound has the formula

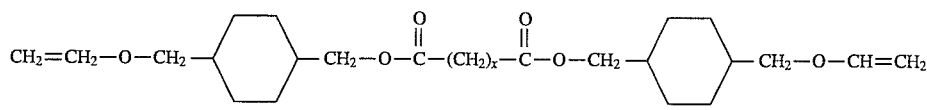

where x is 2, 3, or 4.

17. The process of claim 12 wherein at least one vinyl ether compound has the formula

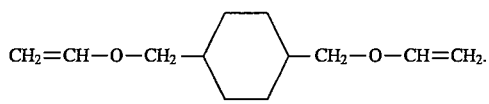

18. The process of claim 12 wherein at least one vinyl ether compound has the formula

where x is 2, 3, or 4.

19. The process of claim 12 wherein at least one vinyl ether compound has the formula

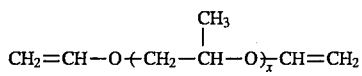

where x is 2, 3, or 4.

20. The process of claim 12 wherein at least one vinyl ether compound has the formula

21. The process of claim 12 wherein at least one vinyl ether compound has the formula

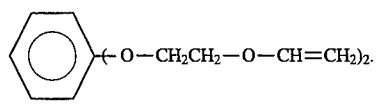

22. The process of claim 12 wherein at least one vinyl ether compound has the formula

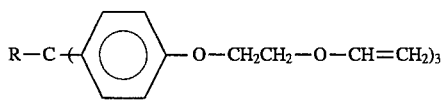

where R is H or $CH_3$.

23. The process of claim 1 wherein said epoxy compounds are derived from at least one member of the group consisting of phenols, novolacs, aliphatic or cycloaliphatic polyols, and polyether polyols.

24. The process of claim 23 wherein said epoxide is a glycidyl ether of bisphenol A.

25. The process of claim 1 wherein said cationic photoinitiator is an onium salt of Group V, VI, and VII elements.

26. The process of claim 25 wherein said cationic photoinitiator is based on an iodonium or sulfonium salt.

27. The process of claim 26 wherein said cationic photoinitiator is a triaryl sulfonium salt of hexafluorophosphate or hexafluoroantimony.

28. The process of claim 26 wherein said cationic photoinitiator is

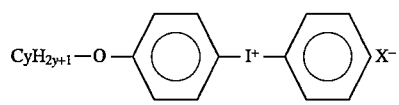

and y is 1 to 18.

29. The process of claim 26 wherein said photoinitiator is

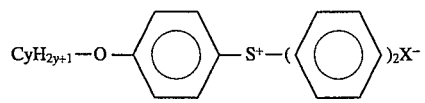

and y is 1 to 18.

30. The process of claim 26 wherein said photoinitiator is at least one member of the group consisting of

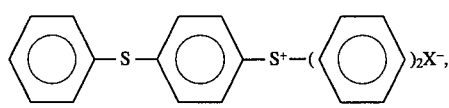

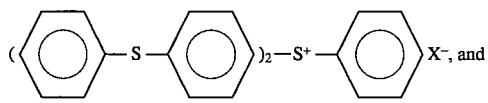

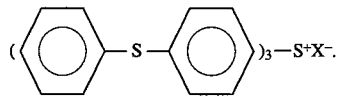

31. The process of claims 28, 29, or 30 wherein $X^-$ is hexafluorophosphate or hexafluoroantimony.

32. The process of claim 26 wherein the photoinitiator is activated by a photosensitizer.

33. The process of claim 26 wherein at least one vinyl ether has the formula

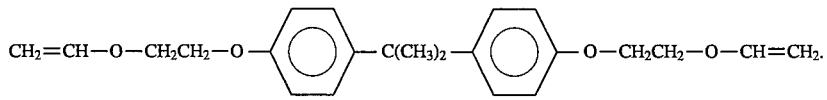

* * * * *